United States Patent [19]

Yamaguchi et al.

[11] Patent Number: 5,500,547
[45] Date of Patent: Mar. 19, 1996

[54] INTEGRATED SEMICONDUCTOR DEVICE WITH TEMPERATURE SENSING CIRCUIT AND METHOD FOR OPERATING SAME

[75] Inventors: Kazumi Yamaguchi; Masami Sawada; Manabu Yamada; Keizo Hagimoto, all of Tokyo, Japan

[73] Assignee: NEC Corporation, Tokyo, Japan

[21] Appl. No.: 364,240

[22] Filed: Dec. 27, 1994

[30] Foreign Application Priority Data

Dec. 28, 1993 [JP] Japan ................... 5-335188

[51] Int. Cl.⁶ ................................... H01L 31/058
[52] U.S. Cl. .............. 257/359; 257/362; 257/467; 257/469; 257/470; 307/117; 307/651
[58] Field of Search .................. 257/491, 467, 257/469, 470, 379, 380, 381, 358, 359, 363; 307/651, 117

[56] References Cited

U.S. PATENT DOCUMENTS 4,896,199  1/1990  Tsuzuki et al. ............ 257/470 X
5,025,298  6/1991  Fay et al. .................. 257/470
5,237,481  8/1993  Soo et al. ................. 257/467 X

FOREIGN PATENT DOCUMENTS 62-156850  7/1987  Japan ....................... 257/470
62-229866  10/1987  Japan .

Primary Examiner—William Mintel

[57] ABSTRACT

A two-way conductive directional circuit formed in a polycrystalline silicon layer separated by an insulation film from a semiconductive element is one-way biased for sensing a temperature of the semiconductive element. The directional circuit may be provided with a bias in either conductive direction thereof for sensing a temperature of the semiconductive element, before being provided with a bias in the other conductive direction thereof for sensing the temperature of the semiconductive element.

4 Claims, 5 Drawing Sheets

⟨TEMPERATURE-VF⟩

⟨TEMPERATURE−VF⟩

DIODE CONNECTION :

INTEGRATED SEMICONDUCTOR DEVICE WITH TEMPERATURE SENSING CIRCUIT AND METHOD FOR OPERATING SAME

BACKGROUND OF THE INVENTION

The present invention relates to an integrated semiconductor device capable of a temperature sensing of internal semiconductive elements, and a method for operating the same.

DESCRIPTION OF THE RELATED ARTS

FIG. 1 shows a conventional integrated semiconductor device of such a type disclosed in Japanese Patent Laid-Open Publication No. 62-229866. As in FIG. 1, it has arrayed therein power MOS FETs 13, lateral MOS transistors 14 and polycrystalline silicon diodes 15, as well as polycrystalline silicon resisters 16 and constant voltage Zener diodes 17. It further includes an $N^+$ type silicon substrate 1, an $N^-$ type silicon epitaxial layer 2 formed on the substrate 1, and P type and N type diffusion layers 3 and 4 formed in the layer 2, respectively.

Moreover, it has a gate oxide film 6, a polycrystalline silicon layer 7, an interlayer insulating film 8, another insulation film 10, and a $P^+$ type diffusion layer 11, a drain electrode 12 and aluminum electrodes 9. Those members have the functions well-known in the art.

FIG. 2 is an equivalent circuit of an essential part of the semiconductor device that includes a MOS transistor 14 $a$ and a diode circuit for sensing a temperature of the transistor. The diode circuit consists of the diodes 15 connected in series.

When the semiconductor substrate has a normal temperature, that is, when the temperature at each junction element of an active semiconductive element is within a normal range, the semiconductive element operates normally. On the contrary, if the substrate temperature abnormally rises, that is, if the junction temperature is raised to be critical, the circuit of diodes 15 sensing the abnormal temperature rise gives a correspondent signal to a control circuit, which then forcibly stops operation of the semiconductive element, thereby preventing the element from being thermally damaged.

The conventional semiconductor device has a temperature sensing circuit formed therein which comprises the diodes 15 connected simply in series, as described. The series connection provides a relatively large temperature coefficient, permitting a facilitated temperature detection to be performed with an increased sensitivity.

However, it necessarily accompanies an withstand voltage at a cathode end of the circuit of diodes 15, which may cause a power breakdown of the diodes 15.

In particular, it thus is subjected to a reduced ESD (electrostatic discharge) durability between the cathode end and an anode end of the circuit of diodes 15.

In this connection, even a single diode circuit can provide a competent temperature coefficient, but is insufficient to always provide a required ESD durability for a current-day high integration.

In other words, undesirable electrostatic charges tend to accumulate at both ends of the diode circuit, as well known in the art, having an increasing electrostatic voltage developed thereacross to exert emfs (electromotive forces) on the charges that may destroy a temperature sensing diode.

SUMMARY OF THE INVENTION

The present invention has been achieved with such points in mind.

It is therefore a principal object of the present invention to provide an integrated semiconductor device having a temperature sensing circuit formed therein, permitting a competent temperature coefficient to be availed, without introducing a reduced ESD durability.

It also is an object of the present invention to provide a method for operating an integrated semiconductor device having a temperature sensing circuit formed therein, providing a relatively long service life in a simple manner.

To achieve the object, the present invention provides an integrated semiconductor device comprising a semiconductive element formed therein, an insulation film formed on the semiconductive element, a polycrystalline silicon layer formed on the insulation film, a two-way conductive directional circuit formed in the silicon layer, and the directional circuit being one-way biased for sensing a temperature of the semiconductive element.

According to the invention, in an integrated semiconductor circuit, a two-way directional circuit that is separated from a semiconductive element by an insulation film is adapted for sensing a temperature of the semiconductive element. The two-way conductive directional circuit should have a pair of one-way conductive circuits different from each other in conductive direction, so that either one-way conductive circuit may be one-way biased for sensing a temperature of the semiconductive element.

The sensing may be effected by use of a diode that can provide a competent temperature coefficient. Any tendency of charge accumulation is cancellable through the other one-way conductive circuit. Any sensed temperature may be detected at a terminal of the directional circuit connected to a control circuit that may be a known type.

Moreover, even if it so happens that a surge current attacks the two-way conductive directional circuit from a reverse direction to a biased direction thereof, one of the two one-way conductive circuits that is reversely biased can effectively conduct to let out the surge current that otherwise might damage a temperature sensing circuit.

According to an embodiment of the invention, the two-way conductive directional circuit comprises a pair of diode circuits having a first diode for sensing the temperature of the semiconductive element and a second diode for neutralizing an accumulated amount of electrostatic charges.

According to another species of the invention, the two-way conductive directional circuit comprises a pair of diode circuits either having a first diode formed with a forward direction thereof in accord with a one-way biased direction of the directional circuit, and a second diode formed with a forward direction thereof reverse to the one-way biased direction of the directional circuit.

According to the species of the invention, in an integrated semiconductor circuit, a directional circuit that is separated from a semiconductive element by an insulation film is adapted to sense a temperature of the semiconductor element, by providing a diode circuit thereof with a (temperature sensing) first diode having its forward direction directed in the direction of an easy flow of the directional circuit, and another diode circuit with a (charge neutralizing) second diode having its forward direction directed in the reverse direction to the direction of the easy flow of the directional circuit.

The first diode tends to conduct a current in the direction of easy flow of the directional circuit, whenever a foward voltage is applied thereto, but the second diode does not. They are circuit components of the diode circuits of the directional circuit and may be connected in parallel to each other at non-defined terminals thereof: they may exemplarily be connected at a conductor joining or bonding area of a size-reduced chip. The directional circuit tends to conduct a current, substantially through the first diode, thus having a potential difference developed thereacross to be detected by a certain adapted circuit that may include a known control circuit for controlling the semiconductive element.

The detectable potential difference represents a voltage drop across the first diode that is proportional to a given temperature coefficient of the diode which itself may comprise a known polycrystalline silicon diode. The temperature coefficient of the first diode thus substitutes for that of the directional circuit, so that the value of the temperature coefficient is maintained as it is.

Moreover, to achieve the object, the present invention provides a method for operating an integrated semiconductor device including a semiconductive element and a two-way conductive directional circuit to be biased for sensing a temperature of the semiconductive element, the method comprising the steps of providing the directional circuit with a bias in either conductive direction thereof for sensing the temperature of the semiconductive element, and providing the directional circuit with a bias in the other conductive direction thereof for sensing the temperature of the semiconductive element.

According to the invention, a two-way conductive directional circuit which should have a pair of one-way conductive circuits is biased in either of two conductive directions thereof in a time-dividing manner. Either bias direction permits an effective temperature sensing of a semiconductive element and an effective cancellation of a charge accumulation tendency. Neither one-way conductive circuit is exclusively used for either the temperature sensing or the charge cancellation. That is, both are effectively utilized, permitting a relatively long service life to the device. Moreover, even if either one-way circuit is damaged, the other can substitute therefor. The time interval for switching the bias direction may be voluntarily set. It may equal to a unit time of an associated system clock or to substantially one half of an expected service life.

BRIEF DESCRIPTION OF THE DRAWINGS

The objects, features and advantages of the present invention will become more apparent from the consideration of the following detailed description, taken in conjunction with the accompanying drawings, in which.

DESCRIPTION OF THE PREFERRED EMBODIMENTS

Figure 1:
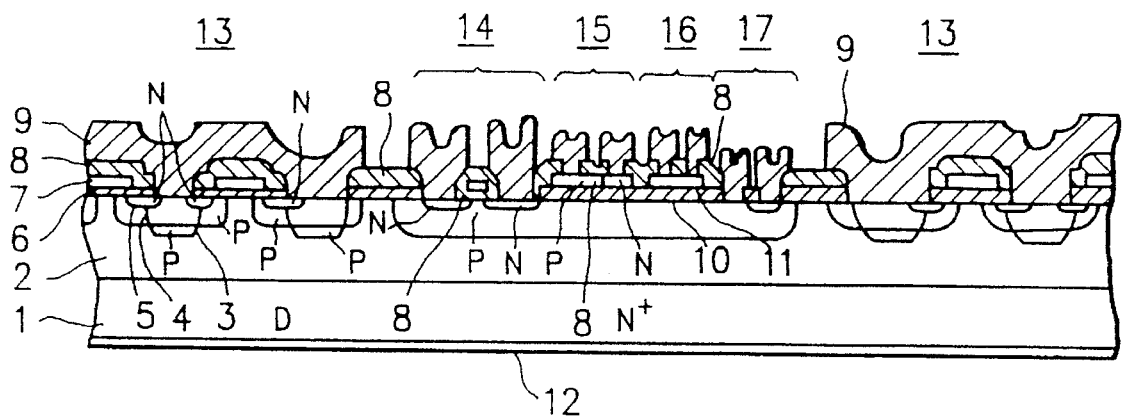
FIG. 1 is a cross sectional view of a conventional semiconductor device.
Figure 2:
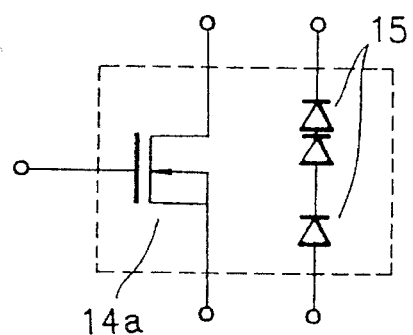
FIG. 2 is a circuit diagram showing an equivalent circuit of an essential part of the semiconductor device of FIG. 1.

Description will be given of an integrated semiconductor circuit according to an embodiment of the invention, with reference to FIGS. 3 to 6. Like or corresponding parts to those of FIG. 1 are designated by like characters. Redundant description of some similar members are omitted for brevity.

Figure 3:
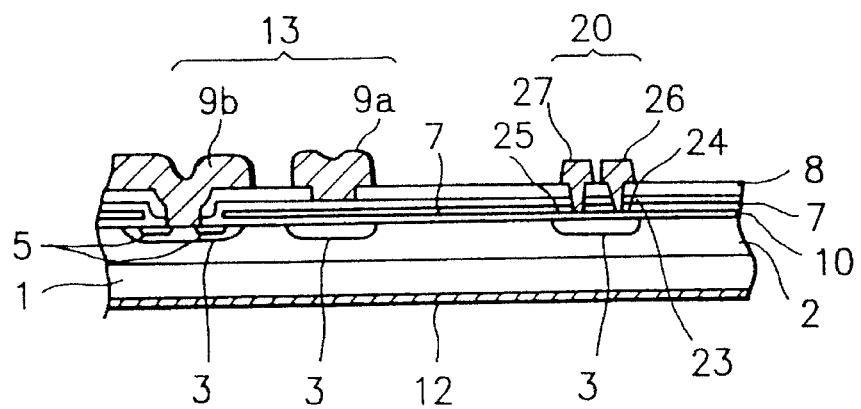
FIG. 3 is a cross sectional view of a semiconductor device according to the invention.
Figures 4A, 4B:
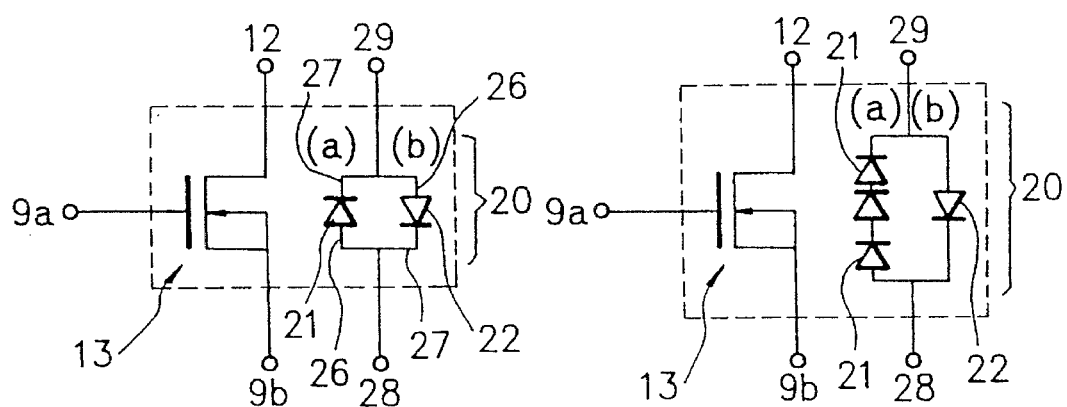
FIG. 4A is a circuit diagram showing an equivalent circuit of an essential part of the semiconductor device of FIG. 3.
FIG. 4B is a circuit diagram showing a modified example of the essential part of FIG. 4A.

FIG. 3 shows an enlarged transverse partial section of a semiconductor device according to an embodiment of the invention, and FIG. 4A shows an equivalent circuit of an essential individual part of the semiconductor device.

The semiconductor device includes a plurality of longitudinally arrayed N-channel depression type power MOS FETs 13 and a plurality of longitudinally arrayed two-way conductive directional circuits 20 in positions transversely one-to-one correspondent to the FETs 13. As shown in FIG. 4A, each two-way directional circuit 20 comprises a pair of one-way conductive circuits (a) and (b) each consisting of a diode 21 or 22 of a known type, respectively. The one-way conductive circuits (a) and (b) are electrically conductive in a reverse direction to each other, and are connected in parallel to each other at a conductor joining or bonding area of the semiconductor device.

The FETs are fabricated as follows:

First, an $N^+$ type silicon substrate 1 is fabricated in a well-known manner. Then, an $N^-$ type silicon epitaxial layer 2 is formed on the substrate 1, before forming a P type diffusion layer 8 as a depletion layer and an N type diffusion layer 5 in surface areas of the epitaxial layer 2.

After the formation of a lower layer (approx. 5000 Å thick) of an insulation film 10, a polycrystalline silicon layer 7 (approx. 6000 Å thick) is formed thereon as a gate layer, which is coated with an upper layer (approx. 500 Å thick) of the insulation film 10 and an interlayer insulation film 8 (approx. 5000 Å thick) formed thereon.

The directional circuits 20 are each provided in a layerwise same position as the gate layer 7 of the FETs 13 by forming, in a separated manner therefrom, a polycrystalline silicon layer 23 (approx. 6000 Å thick) on the lower layer of the insulation film 10. The polycrystalline silicon layer 23 comprises a P type anode layer 24 and an N type cathode layer 25. On the silicon layer 23 also is formed an upper layer (approx. 500 Å thick) of the insulation film 10 and the interlayer insulation film 8 (approx. 5000 Å thick).

Each FET 13 is provided with a gate electrode 9a, a source electrode 9b and a drain electrode 12. Each diode 21, 22 has an anode electrode 26 and a cathode electrode 27, while they are shown in a combined form in the equivalent circuit of FIG. 4A.

It will be understood that in a plan view a plurality of local anode layer segments and a plurality of local cathode layer segments are longitudinally arrayed in a staggered and alternately intervening manner to constitute a longitudinal array of pairs of diodes 21, 22 put in a reverse parallel relation to each other, and each diode has the anode electrode 26 and the cathode electrode 27.

The individual part shown in FIG. 4A includes one FET 13 and one directional circuit 20 biased for sensing a peripheral temperature of the FET 13.

The directional circuit 20 comprises the one-way conductive circuit (a) consisting of the diode 21 having its forward direction (i.e. the direction of an easy flow) in the direction from its anode electrode 26 to its cathode electrode 27 that is in accord with a biased direction of the directional circuit 20, which is subjected to a positive bias voltage $V_f$ at a bias end terminal 28 thereof and is connected at a detection end terminal 29 thereof to an unshown FET control circuit of a known type; and the one-way conductive circuit (b) consisting of the diode 22 having its forward direction in the direction from the terminal 29 to the terminal 28 of the directional circuit, that is a reverse direction to the biased direction thereof. Accordingly, the circuit 20 is a two-way conductive directional circuit.

With the bias voltage $V_f$ applied to the terminal 28 of the directional circuit 20, the forwardly biased diode 21 conducts a current $I_f$, such that $I_f=\Delta V/r_f$, where $\Delta V$ is a voltage drop across the diode 21, and $r_f$ is an internal resistance of the diode 21 that varies depending upon the peripheral temperature of the FET 13.

However, the reversely biased diode 22 does not conduct any significant current, subject to a negligible or compensative leakage current, so that the voltage drop $\Delta V$ across the diode 21 substantially substitutes for a total voltage drop across the circuit 20, which is detected at the detection end to provide a temperature signal to the FET control signal, where it is processed to turn off the FET 13 if the signal represents a critical temperature.

When undesirable positive and negative electrostatic charges tend to accumulate at both ends of the of the circuit 20 (i.e. at both sides of the cathode of each diode 21, 22), having an increasing electrostatic voltage developed thereacross to exert emfs on the charges, those charges tending to produce a current in the forward direction of the circuit 20 are neutralized through the forward biased diode 21 and the remaining charges tending to produce a current in the reverse direction to the forward direction of the circuit 20 are neutralized through the reverse biased diode 22.

Should a surge current happen to attack the directional circuit 20, the diodes 21, 22 cooperate with each other to let it out irrespective of the incoming direction of the surge current that otherwise might damage a one-way conductive diode circuit when it has occurred at a cathode end of the circuit.

Figure 5:
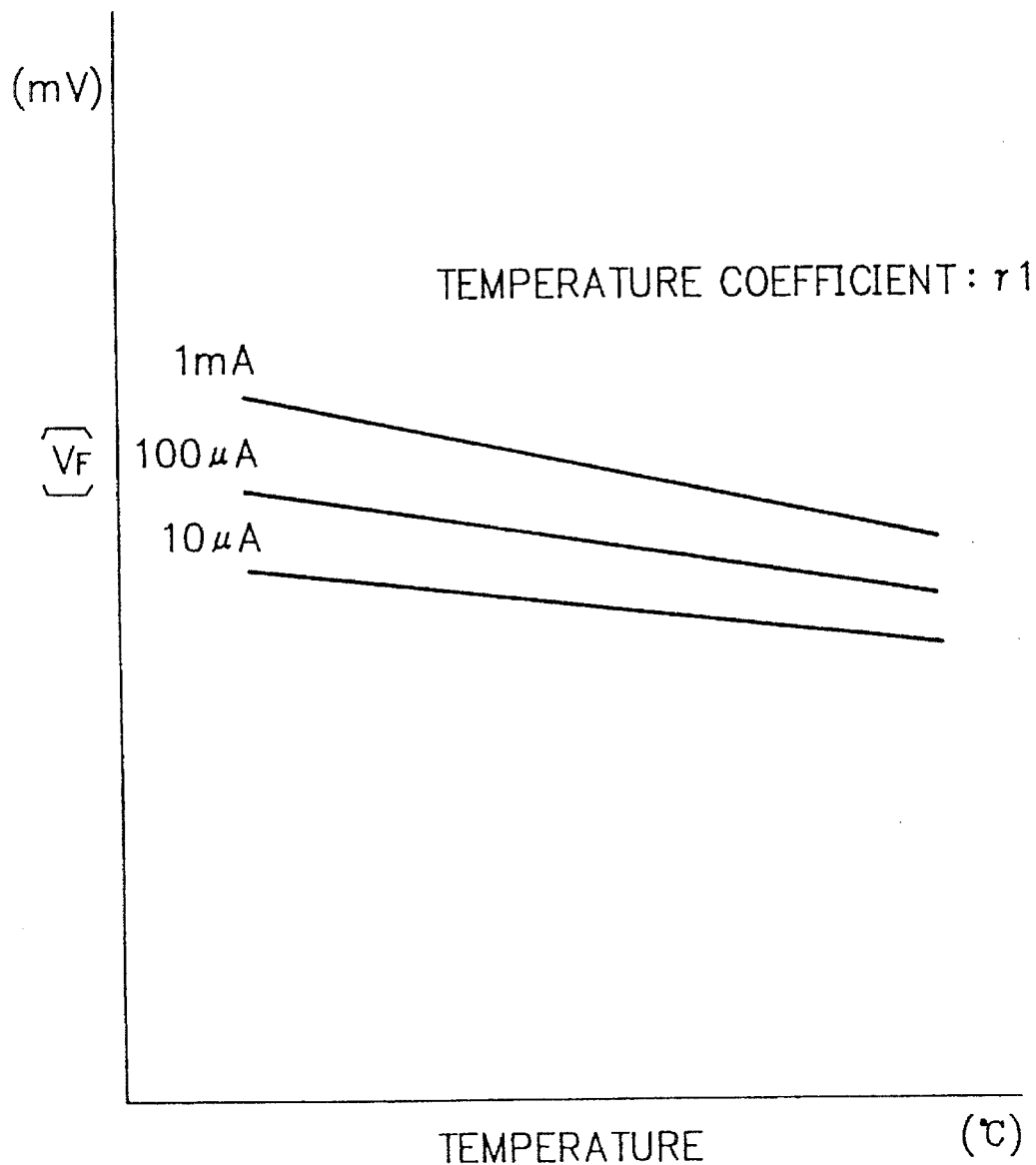
FIG. 5 is a graph showing a voltage vs. temperature relationship of a single diode for various forward currents having their associated temperature coefficients.
Figure 6:
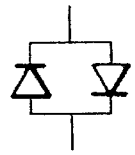
FIG. 6 is a graph showing a voltage vs. temperature relationship of a pair of reversely paralleled diodes for various forward currents having their associated temperature coefficients.
Figure 6:
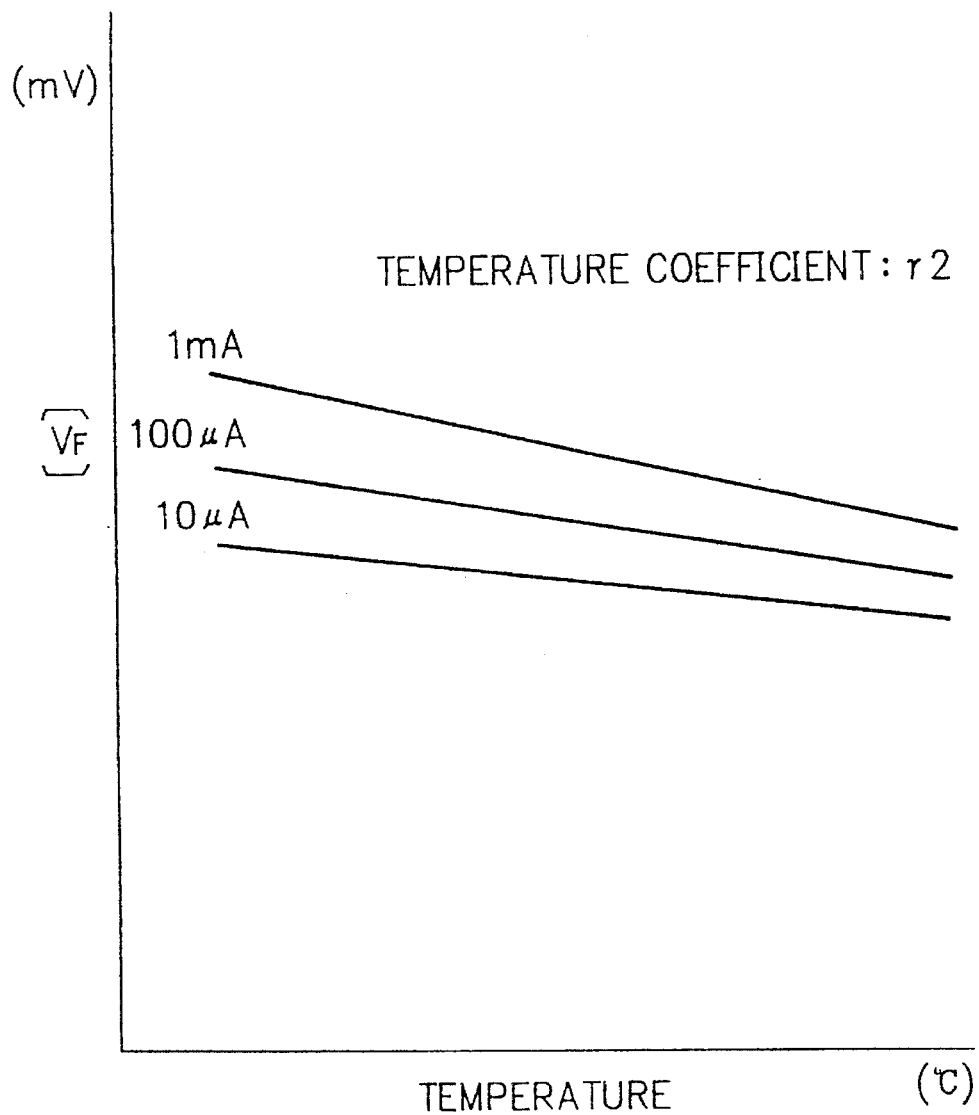

FIG. 5 shows a number of voltage $V_f$ vs. temperature curves of a temperature sensing single-diode circuit for various forward currents $I_f$ (1 mA, 100 μA, 10 μA) having associated temperature coefficients $\gamma_1$, and FIG. 6 shows the same number of voltage $V_f$ vs. temperature curves of the two-way conductive directional circuit 20 for equivalent forward currents $I_f$ (1 mA, 100 μA, 10 μA) having associated temperature coefficients $\gamma_2$. Employed diodes are identical to each other in constitution and performance, except for the connection.

It will be seen from these Figures that the two-way conductive directional circuit 20 provides a competent temperature coefficient $\gamma_2$ for each reference current.

Table 1 in the next page shows a comparison of the ESD durability between the circuit of FIG. 5 and the circuit of FIG. 6.

As will be seen from Table 1, the ESD durability is improved from 150 Vdc to 200 Vdc (i.e. approx. 33%) at the reverse bias end of circuit. This improvement is achieved by the provision of a reverse biased diode circuit (b) connected in parallel to a forward biased diode circuit (a).

According to the present embodiment of the invention, therefore, a two-way conductive directional circuit permits a competent temperature coefficient $\gamma^{mv}/°$ C. to be availed in addition to an improved ESD durability.

In this respect, the polycrystalline silicon layer or local region thereof may preferably have an adapted peripheral length to a yet improved ESD durability.

TABLE 1

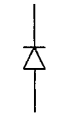

| Connection | Durable voltage at forward end | Durable voltage at reverse end |
|---|---|---|
| | 180 Vdc | 150 Vdc |
| | 200 Vdc | 200 Vdc |

FIG. 4B shows a modified example of the embodiment described. This Figure substantially corresponds to FIG. 4A, and like members to those of FIG. 4A are designated by like characters, without description. In this modification, a forward conductive diode circuit (a) of a two-way conductive directional circuit 20 comprises a plurality of forward biased diodes 21 connected in series, which gives an increased temperature coefficient.

It will be understood that a reverse conductive diode circuit (b) of the two-way conductive directional circuit 20 may also comprise a plurality of reverse biased diodes connected in series or parallel.

Figure 7:
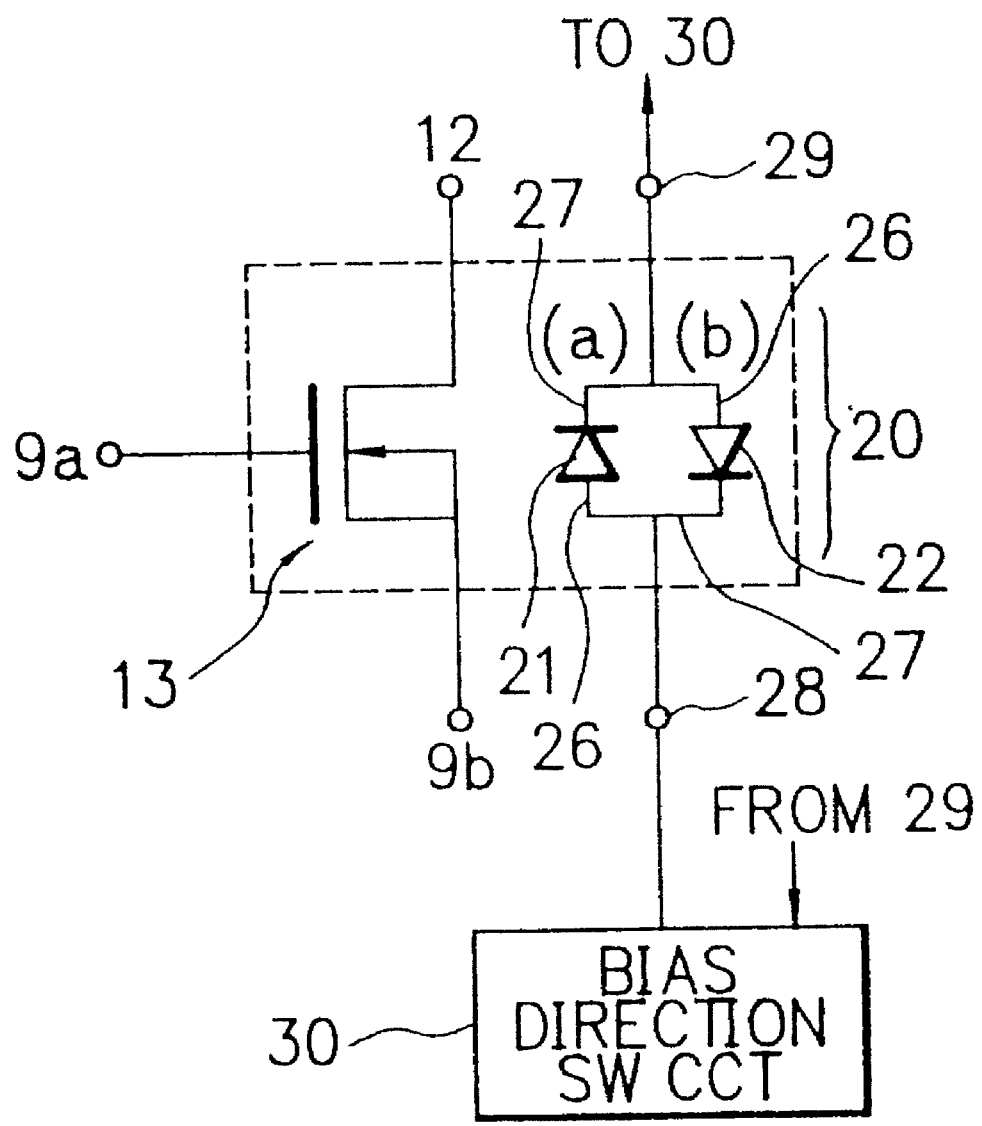
FIG. 7 is a circuit diagram showing another embodiment of the invention.

FIG. 7 shows an equivalent circuit of an essential part of an integrated semiconductor device according to another embodiment of the present invention. This Figure corresponds to FIG. 4A in constitution of an FET and a two-way conductive directional circuit, and like members to those of FIG. 4A are designated by like characters.

In this embodiment, a two-way conductive directional circuit 20 has a bias direction switching circuit 30 interconnected between the circuit 20 and an unshown external circuitry that includes a bias supply line, a temperature detecting FET control circuit and a clock signal supply line or a switching control circuit.

The switching circuit 30 comprises a cross switch for switching over the connection of a bias end terminal 28 of the directional circuit 20 from a bias supply side to a temperature detection side, and concurrently that of a detection end terminal 29 of the directional circuit 20 from the temperature detection side to the bias supply side, and vice versa. The cross switch is responsive to a clock signal or a switching control signal to effect the cross switching operation.

Through the switching circuit 30, the directional circuit 20 is operated so that it is provided with a bias in either conductive direction thereof for sensing a temperature of an associated FET 13 during a certain time interval, and with a bias in the other conductive direction thereof for sensing the temperature of the FET 13 during a subsequent time interval. The time intervals may be volutarily determined.

It will be seen that either bias direction permits an effective temperature sensing of the FET 13 as well as an effective cancellation of a charge accumulation tendency, because the constitution of the directional circuit 20 is substantially symmetrical. Neither one-way conductive circuit (a) nor (b) is exclusively used for either the temperature sensing or the charge cancellation. That is, both (a) and (b) are effectively utilized, providing a relatively long service life of the device. Moreover, even if either circuit (a) or (b) is damaged, the other circuit (b) or (a) can substitute therefor.

While the present invention has been described with reference to the particular illustrative embodiments, it is not to be restricted by those embodiments but only by the appended claims. It is to be appreciated that those skilled in the art can change or modify the embodiments without departing from the scope and spirit of the present invention.

What is claimed is:

1. An integrated semiconductor device comprising:
    a semiconductive element formed therein;
    an insulation film formed on the semiconductive element;
    a polycrystalline silicon layer formed on the insulation film;
    a two-way conductive directional circuit formed in the silicon layer; and
    the directional circuit being one-way biased for sensing a temperature of the semiconductive element.

2. The semiconductor device as claimed in claim 1, wherein:
    the two-way conductive directional circuit comprises a pair of diode circuits, one of said diode circuits having a first diode for sensing the temperature of the semiconductive element and another of said diode circuits having a second diode for neutralizing an accumulated amount of electrostatic charges.

3. The semiconductor device as claimed in claim 1, wherein:
    the two-way conductive directional circuit comprises a pair of diode circuits, one of said circuits having a first diode formed with a forward direction thereof in accord with a one-way biased direction of the directional circuit and another of said circuits having a second diode formed with a forward direction thereof reverse to the one-way biased direction of the directional circuit.

4. A method for operating an integrated semiconductor device including a semiconductive element and a two-way conductive directional circuit, the method comprising the steps of:
    providing the directional circuit with a bias in one of two conductive directions thereof for sensing a temperature of the semiconductive element, and
    providing the directional circuit with a bias in the other of the two conductive directions thereof for sensing the temperature of the semiconductive element.

* * * * *